United States Patent
Hung et al.

(10) Patent No.: US 10,664,024 B2
(45) Date of Patent: May 26, 2020

(54) HARD DRIVE CARRIER WITH A HANDLE THAT IS ROTATABLE BETWEEN AN OPEN POSITION AND A CLOSED POSITION TO ENGAGE A SLED OF AN INFORMATION HANDLING SYSTEM

(71) Applicant: DELL PRODUCTS, L.P., Round Rock, TX (US)

(72) Inventors: Hsiang-Yin Hung, Taipei (TW); Chi-Feng Lee, Taipei (TW); Raymond D. Heistand, II, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 13 days.

(21) Appl. No.: 15/725,690

(22) Filed: Oct. 5, 2017

(65) Prior Publication Data

US 2019/0107869 A1 Apr. 11, 2019

(51) Int. Cl.
*G06F 1/18* (2006.01)
*G11B 33/12* (2006.01)
*H05K 7/16* (2006.01)
*H05K 7/18* (2006.01)
*H05K 7/14* (2006.01)

(52) U.S. Cl.
CPC ............ *G06F 1/187* (2013.01); *G11B 33/124* (2013.01); *G11B 33/128* (2013.01); *H05K 7/1489* (2013.01); *H05K 7/16* (2013.01); *H05K 7/18* (2013.01)

(58) Field of Classification Search
CPC ...... G06F 1/187; G11B 33/124; G11B 33/128; H05K 7/16; H05K 7/18
See application file for complete search history.

(56) References Cited

U.S. PATENT DOCUMENTS

| | | | | |
|---|---|---|---|---|
| 5,588,728 A | * | 12/1996 | Eldridge | G11B 33/025 312/223.1 |
| 5,641,296 A | * | 6/1997 | Larabell | G06F 1/184 439/157 |
| 6,000,654 A | * | 12/1999 | Hirabayashi | G11B 33/124 242/338.4 |
| 6,774,808 B1 | * | 8/2004 | Hibbs | G06F 1/184 340/686.4 |
| 7,193,856 B2 | * | 3/2007 | Hidaka | G11B 33/126 211/190 |
| 9,426,920 B2 | | 8/2016 | Terwilliger et al. | |
| 9,437,250 B2 | | 9/2016 | Mundt et al. | |
| 9,546,674 B1 | * | 1/2017 | Chen | F16B 2/18 |
| 9,947,371 B1 | * | 4/2018 | Hu | G11B 33/005 |

(Continued)

*Primary Examiner* — Daniel P Wicklund
*Assistant Examiner* — Douglas R Burtner
(74) *Attorney, Agent, or Firm* — Isidore PLLC

(57) ABSTRACT

The hard drive carrier includes a sliding bracket dimensioned to receive a hard drive, a stationary frame coupled to the sliding bracket, and a handle coupled to both the sliding bracket and the stationary frame. The handle rotates about an axis. The hard drive carrier is configured to engage with a sled at a first position while the handle is in a partially open position. The first position allows insertion of the hard drive carrier into the sled while the handle is prevented from closing. The hard drive carrier is further configured to move to a second position in the sled. The hard drive carrier transitions into a hard drive bay of the sled in the second position.

20 Claims, 16 Drawing Sheets

(56) References Cited

U.S. PATENT DOCUMENTS

| | | | |
|---|---|---|---|
| 2005/0068720 A1* | 3/2005 | Lambert | G06F 1/184 361/679.03 |
| 2005/0111178 A1* | 5/2005 | Bradley | G06F 1/184 361/679.38 |
| 2005/0152106 A1* | 7/2005 | Coster | G06F 1/181 361/679.58 |
| 2005/0270727 A1* | 12/2005 | Shih | G11B 15/68 361/679.43 |
| 2013/0070422 A1* | 3/2013 | Dunham | G06F 1/187 361/725 |
| 2014/0119816 A1* | 5/2014 | Hsiao | G11B 33/128 403/322.4 |
| 2015/0201520 A1* | 7/2015 | Jau | G06F 1/187 211/26 |
| 2015/0235673 A1 | 8/2015 | Lo | |
| 2015/0327414 A1* | 11/2015 | Jau | H05K 13/0084 206/701 |
| 2017/0055360 A1* | 2/2017 | Della Fiora | H05K 7/1487 |
| 2018/0197579 A1* | 7/2018 | Chen | G11B 33/128 |
| 2018/0220544 A1* | 8/2018 | Wang | H05K 7/1402 |

* cited by examiner

HARD DRIVE CARRIER WITH A HANDLE THAT IS ROTATABLE BETWEEN AN OPEN POSITION AND A CLOSED POSITION TO ENGAGE A SLED OF AN INFORMATION HANDLING SYSTEM

BACKGROUND

1. Technical Field

The present disclosure generally relates to information handling systems and in particular to a hard drive carrier for an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system can include a number of device enclosures. An example of a device enclosure is a hard drive enclosure, which can hold multiple hard drives that are typically installed in the hard drive enclosures. The hard drives are communicatively and electrically connected to a backplane of a system enclosure with a connector such as a serial attached small computer system interface (SCSI) connector.

BRIEF SUMMARY

Disclosed are an information handling system (IHS), a hard drive carrier, and a method of manufacturing a hard drive carrier.

According to one embodiment, an IHS includes a hard drive carrier that has a sliding bracket dimensioned to receive a hard drive, a stationary frame coupled to the sliding bracket, and a handle coupled to both the sliding bracket and the stationary frame. The handle rotates about an axis. The hard drive carrier is configured to engage with a sled at a first position while the handle is in a partially open position. The first position allows insertion of the hard drive carrier into the sled while the handle is prevented from closing. The hard drive carrier is further configured to move to a second position in the sled. The hard drive carrier transitions into a hard drive bay of the sled in the second position.

Also disclosed is a hard drive carrier. The hard drive carrier includes a sliding bracket dimensioned to receive a hard drive, a stationary frame coupled to the sliding bracket, and a handle coupled to both the sliding bracket and the stationary frame. The handle rotates about an axis. The hard drive carrier is configured to engage with a sled at a first position while the handle is in a partially open position. The first position allows insertion of the hard drive carrier into the sled while the handle is prevented from closing. The hard drive carrier is further configured to move to a second position in the sled. The hard drive carrier transitions into a hard drive bay of the sled in the second position.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1A:
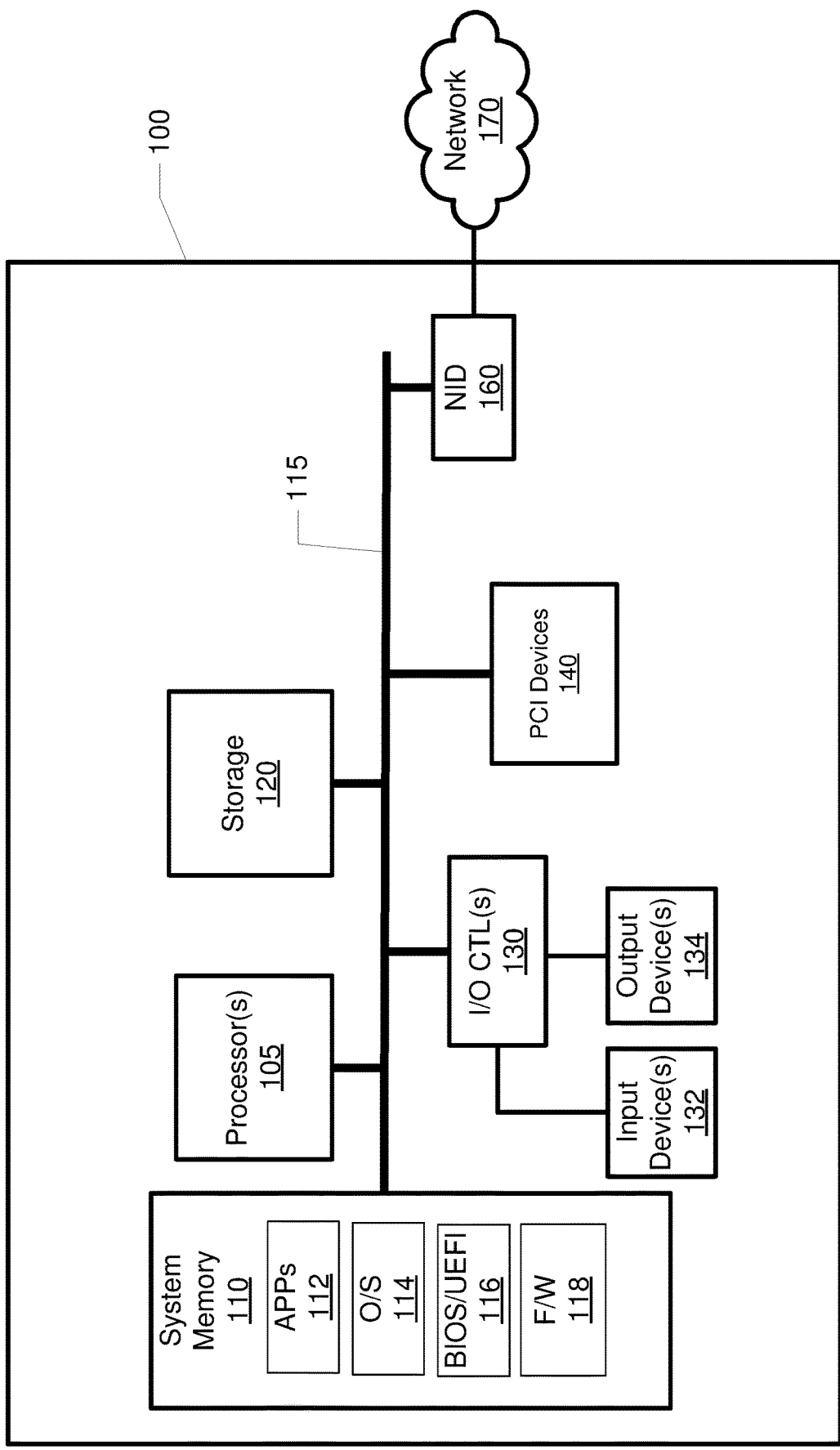
FIG. 1A illustrates an example information handling system within which various aspects of the disclosure can be implemented, according to one or more embodiments.

The illustrative embodiments provide an information handling system (IHS), a hard drive carrier, and a method of manufacturing a hard drive carrier. The hard drive carrier includes a sliding bracket dimensioned to receive a hard drive, a stationary frame coupled to the sliding bracket and a handle coupled to both the sliding bracket and the stationary frame. The handle rotates about an axis. The hard drive carrier is configured to engage with a sled at a first position while the handle is in a partially open position. The first position allows insertion of the hard drive carrier into the sled while the handle is prevented from closing. The hard drive carrier is further configured to move to a second position. The hard drive carrier transitions into a hard drive bay of the sled in the second position.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1A illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1A, example IHS 100 includes one or more processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can include one or more hard drives or solid state drives that are mounted within a system enclosure as will be described below. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI), and can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output devices 134, such as a monitor or display device or audio speaker(s) or light emitting diodes (LEDs). Additionally, in one or more embodiments, system interconnect 115 is further coupled to peripheral component interconnect (PCI) devices 140. PCI devices 140 can include modems, network cards, sound cards, video cards, shared memory, solid state drives and other hardware devices.

IHS 100 further comprises a network interface device (NID) 160. NID 160 enables IHS 100 to communicate and/or interface with other devices, services, and components that are located external to IHS 100. These devices, services, and components can interface with IHS 100 via an external network, such as example network 170, using one or more communication protocols. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Figure 1B:
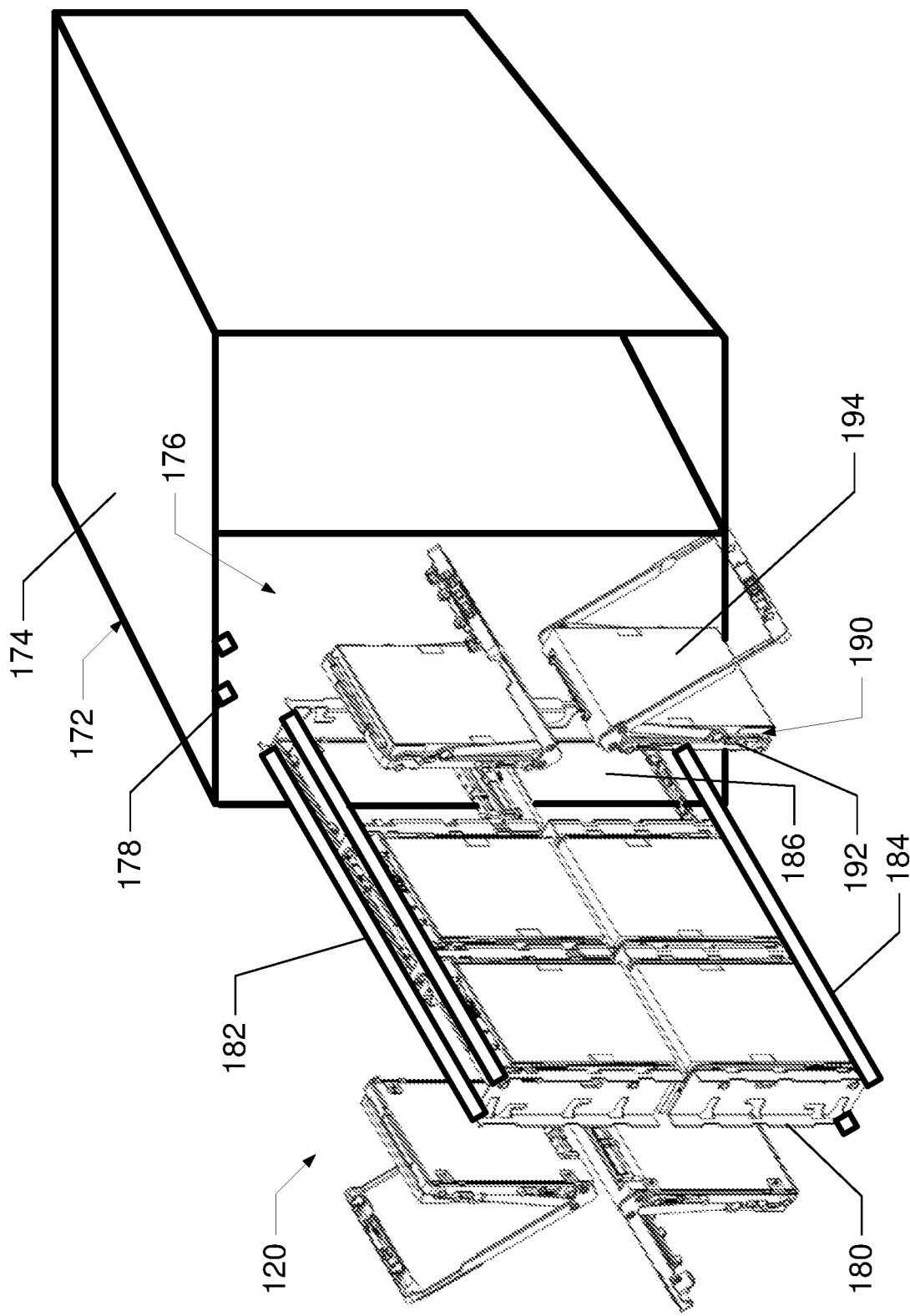
FIG. 1B illustrates a front perspective view of a system enclosure for an information handling system, according to one or more embodiments.

In the discussion of the following figures, the description of each figure can include general reference to the specific components illustrated within the preceding figures. Turning to FIG. 1B, a system enclosure 172 is shown. System enclosure 172 can package and contain the various components of IHS 100. System enclosure 172 includes a housing 174 that defines one or more chambers 176. One or more retention features 178 are mounted to housing 174. System enclosure 172 can further include a storage sled or sled 180. Sled 180 can contain components of storage 120 of IHS 100 such as hard drives. Sled 180 includes top slide rail 182, bottom slide rail 184 and hard drive bay 186. Slide rails 182 and 184 mate with retention features 178 such that a user can manually slide sled 180 into and out from chamber 176. Hard drive carrier assembly 190 includes hard drive carrier 192 and an attached hard drive 194. A user can manually insert and remove hard drive carrier assembly 190 into and out of hard drive bay 186. Sled 180 can hold multiple hard drive carrier assemblies in different hard drive bays.

Figure 2A:
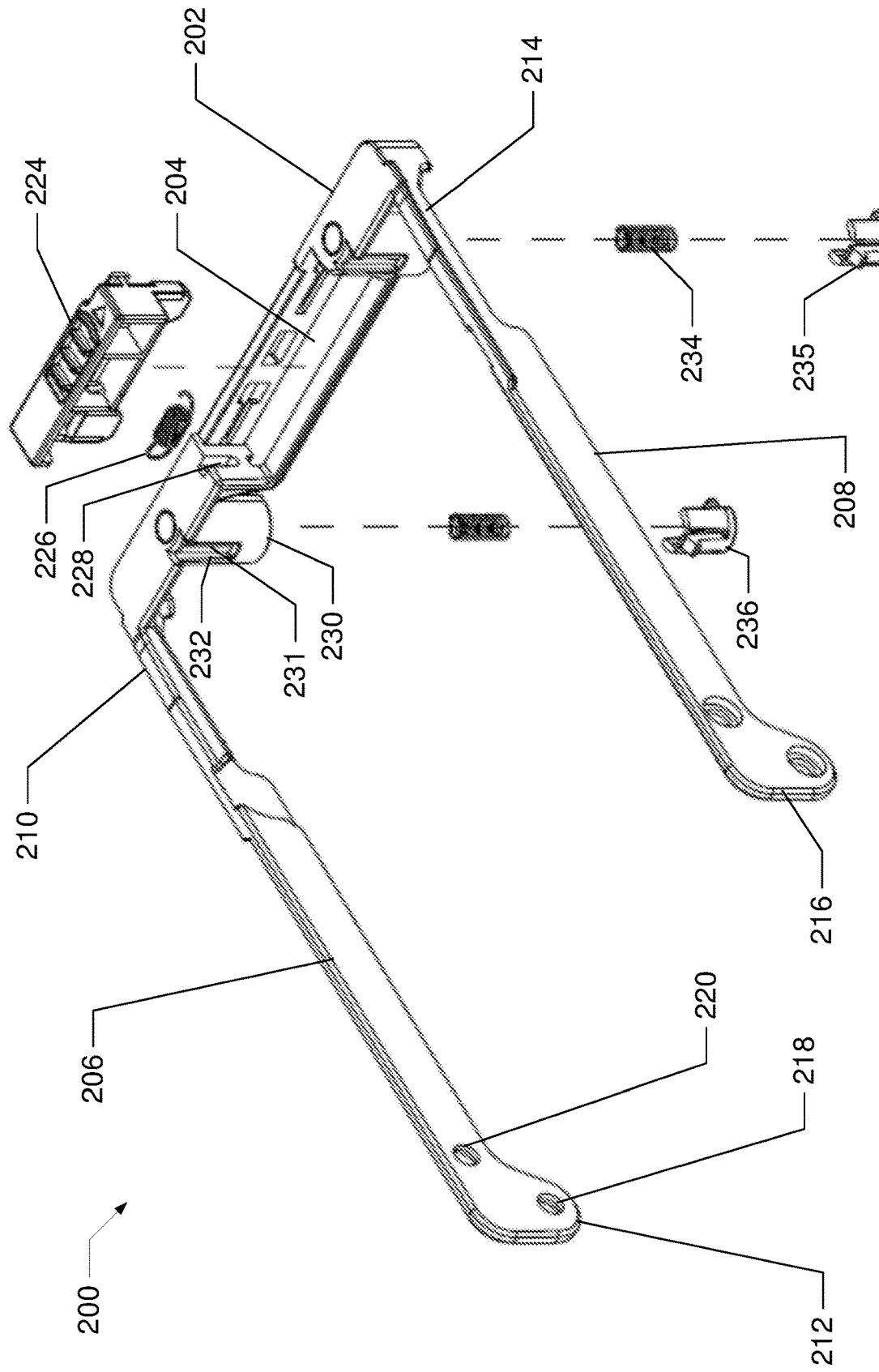
FIG. 2A illustrates a top perspective view of a hard drive carrier handle, according to one or more embodiments.

With reference now to FIG. 2A, there is shown a handle 200 for a hard drive carrier. Handle 200 includes a base leg 202 and parallel opposed side legs 206 and 208 that extend away from opposite ends of base leg 202. Side leg 206 has ends 210 and 212. End 210 is attached to one end of base leg 202. Side leg 210 has ends 214 and 216. End 216 is attached to the other end of base leg 202. Apertures 218 and 220 are formed in each of the ends 212 and 216.

A latch cavity 204 is defined in base leg 202. Latch 224 is received for sliding movement within latch cavity 204. Handle 200 further includes return spring 226, which has one end retained by groove 228 and another end connected to latch 224. Return spring 226 biases latch 224 toward side leg 206. Latch 224 can be manually moved along the axis of base leg 202 away from side leg 206. Base leg 202 further includes a downwardly extending pair of drums 230 each having a bore 231 and a slot 232. Spring 234 are mounted in each bore 231 and plungers 236 are mounted over each spring 234 in bores 231. Each plunger 236 has a rib 235 that extends through slot 232 in order to retain plunger 236 to drum 230 within bore 231. Springs 234 bias plungers 236 away from base leg 202. Each plunger 236 can slide within bore 231.

Figure 2B:
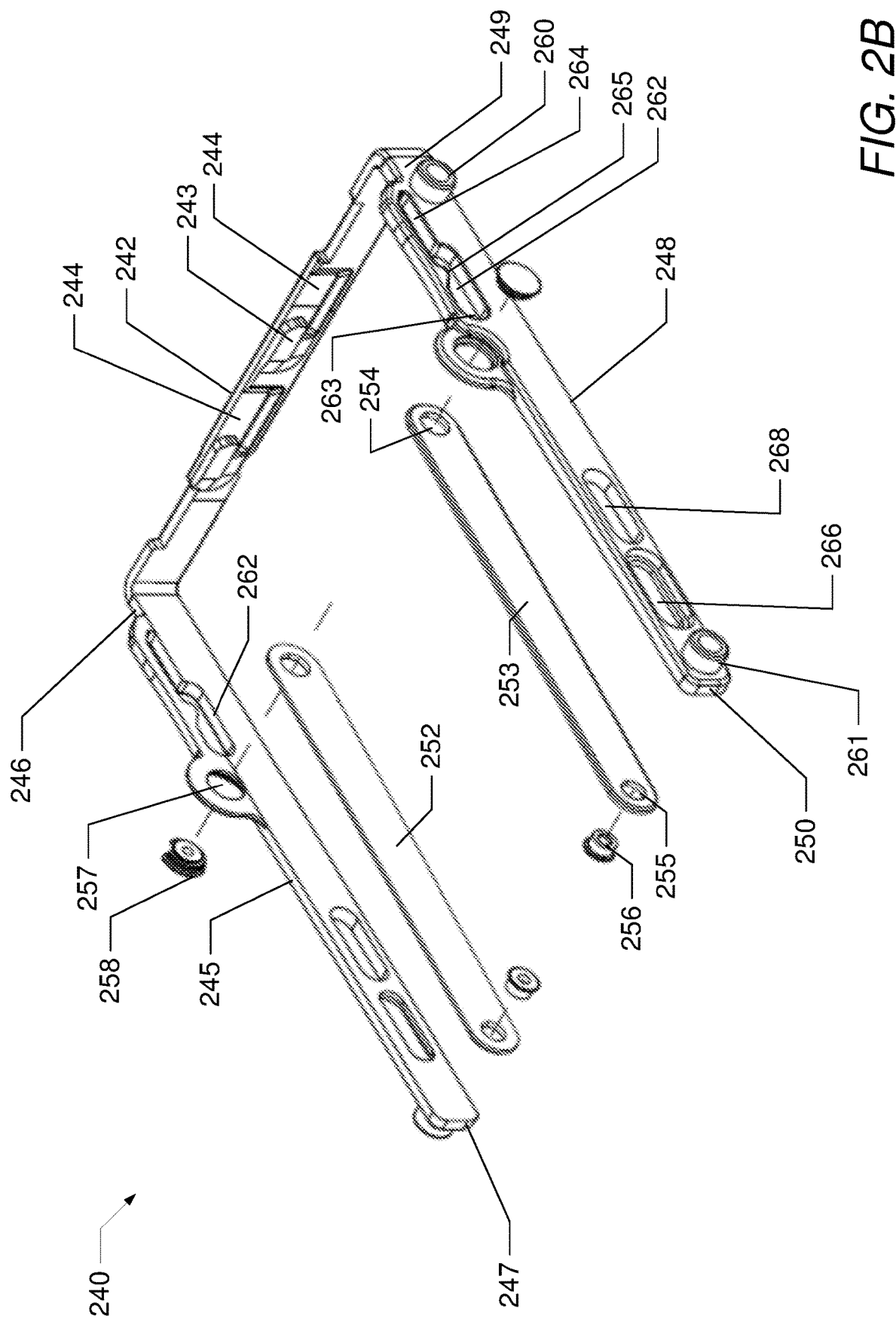
FIG. 2B illustrates a top perspective view of a hard drive carrier stationary frame, according to one or more embodiments.

Turning to FIG. 2B, a stationary frame 240 for a hard drive carrier is shown. Stationary frame 240 includes a base rail 242, a side rail 245 and an opposed side rail 248 that both extend from the base rail. Side rail 245 has ends 246 and 247. End 246 is attached to one end of base rail 242. Side rail 248 has ends 249 and 250. End 249 is attached to the other end of base rail 242. A pair of openings 244 is located in base rail 242. A hook 243 extends into each of the openings 244. Several slots are located in each of the side rails. Each side rail 245 and 248 includes slots 262, 266 and 268. Slot 262 has slot ends 263 and 264. A finger 265 extends downwardly into each of slots 262. Side rails 245 and 248 further include posts 260 and 261, respectively and holes 257. Posts 260 and 261 extend in opposite directions away from respective side rails 245 and 248. Holes 257 are located toward the center of side rails 245 and 248 and spaced from slots 262.

Stationary frame 240 further includes arms 252 and 253. Each of the arms 252 and 253 has a hole 254 at one end and a hole 255 at the other end. Pivot pins 258 are press-fit into holes 257 and allow arms 252 and 253 to rotate relative to side rails 245 and 248. Threaded inserts 256 are press-fit into each of holes 255.

Figure 2C:
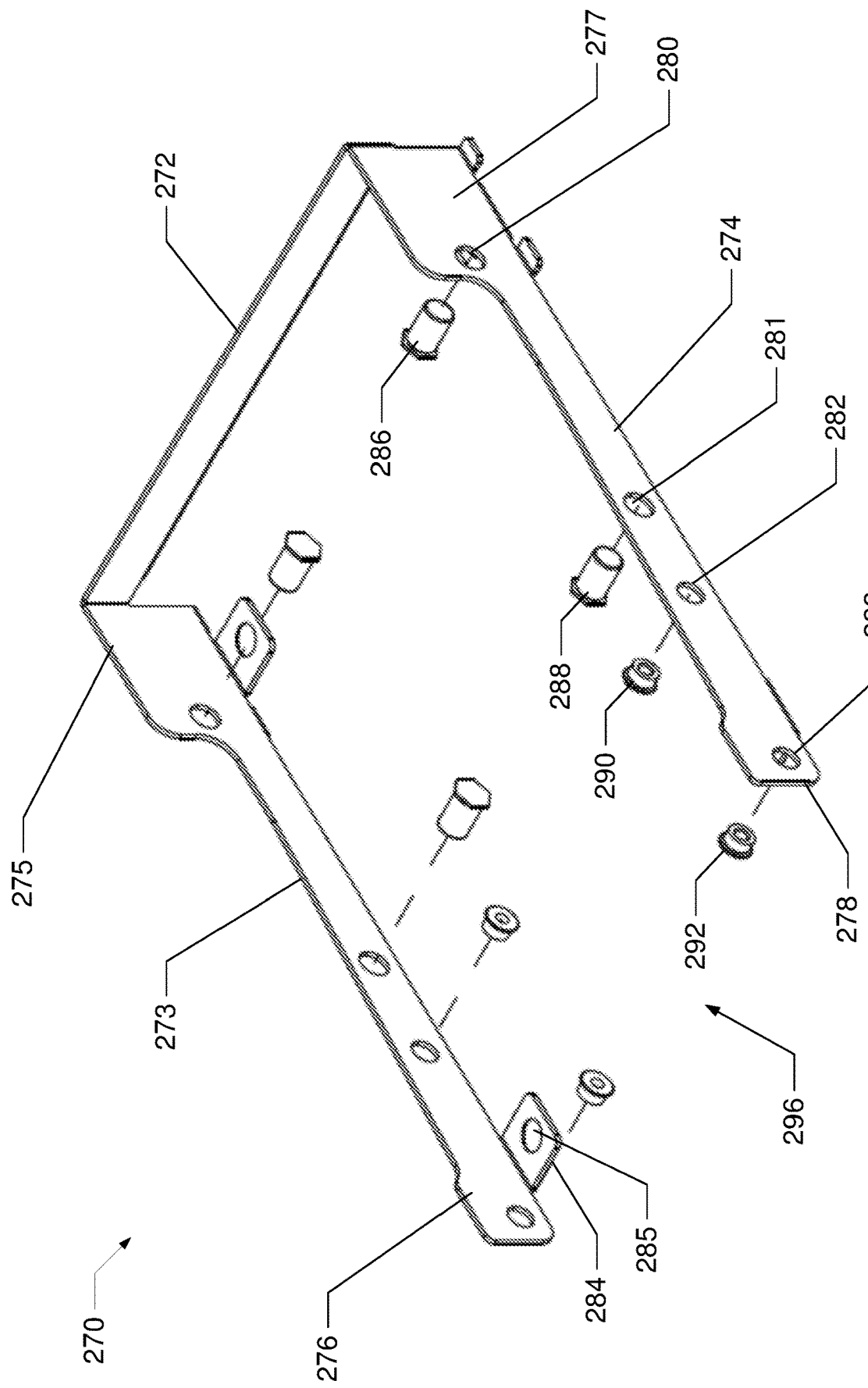
FIG. 2C illustrates a top perspective view of a hard drive carrier sliding bracket, according to one or more embodiments.

Referring to FIG. 2C, a sliding bracket 270 for a hard drive carrier is shown. Sliding bracket 270 includes a base beam 272, a side beam 273, and an opposed side beam 274. The side beams 273 and 274 both extend from the base beam 272. Side beam 273 has ends 275 and 276. End 275 is attached to one end of base beam 272. Side beam 274 has ends 277 and 278. End 277 is attached to the other end of base beam 272. Several holes are located in each of the side beams. Each side beam 273 and 274 includes holes 280, 281, 282 and 283. Guide pins 286 are mounted in holes 280 and guide pins 288 are mounted in holes 281. Sliding bracket 270 further includes two tabs 284 that extend inwardly from side beam 273 and two tabs 284 that extend inwardly from side beam 274. Each of the tabs 284 has an aperture 285. Tabs 284 are used to attach a hard drive to sliding bracket 270. Threaded inserts 290 are mounted in holes 282 and threaded inserts 292 are mounted in holes 283 of side beam 274. Similarly, guide pins and threaded inserts are also mounted in side beam 273.

Figure 3:
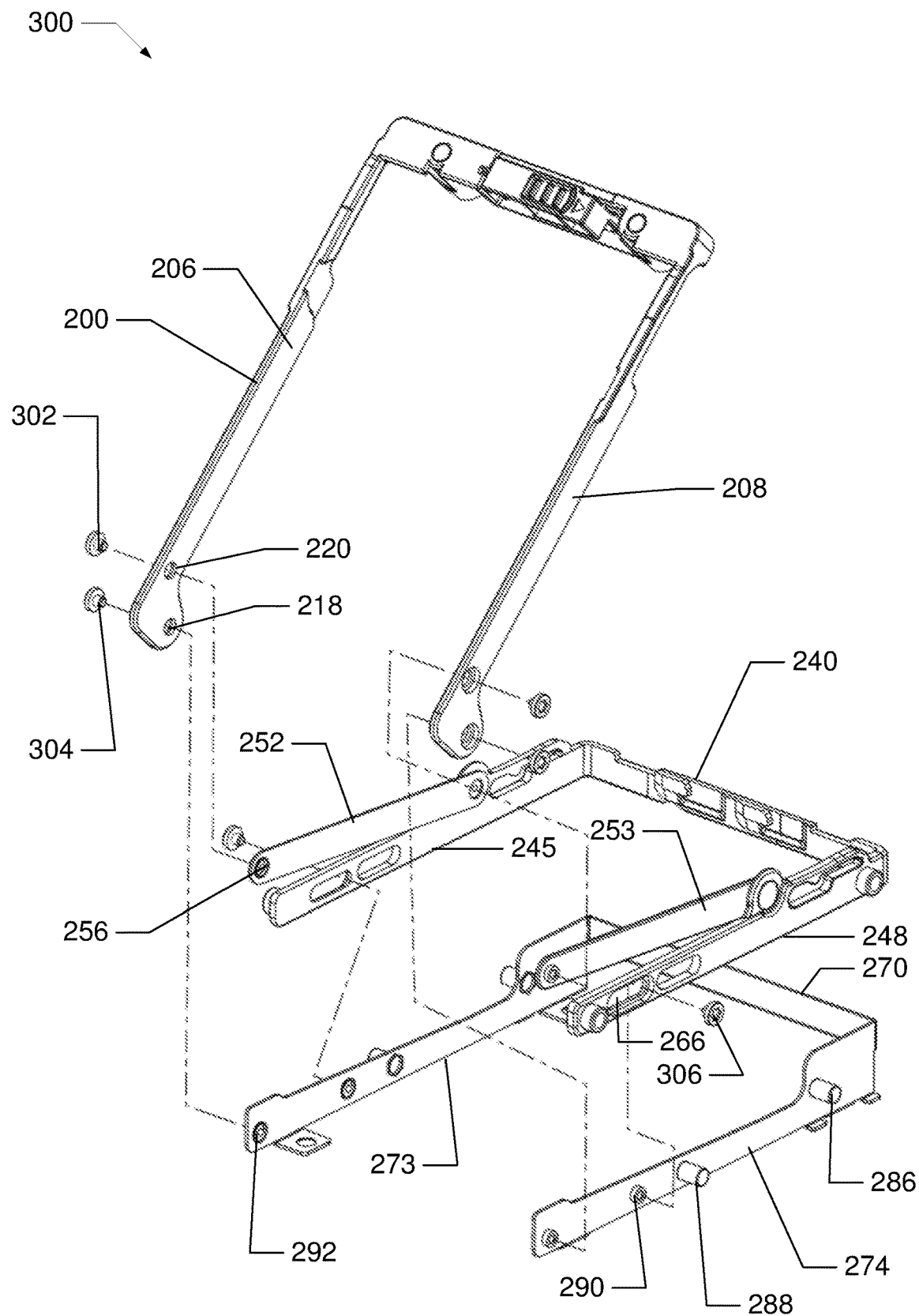
FIG. 3 illustrates an exploded view of a hard drive carrier, according to one or more embodiments.

FIG. 3 illustrates an exploded view of hard drive carrier 300 including handle 200, stationary frame 240 and sliding bracket 270. Guide pins 286 and 288 are shown extending through side beams 273 and 274. Arms 252 and 253 are shown attached to side rails 245 and 248, respectively. Fastener 302, such as a screw, extends through aperture 220 and is received in threaded insert 256, thereby rotatably coupling arm 252 to side leg 206. Similarly, another fastener 302 extends through aperture 220 and is received in threaded insert 256, thereby rotatably coupling arm 253 to side leg 208.

Fastener 304, such as a screw, extends through aperture 218 and is received in threaded insert 292, thereby rotatably coupling side leg 206 to side beam 273. Similarly, another fastener 304 extends through aperture 218 and is received in threaded insert 292, thereby rotatably coupling side leg 208 to side beam 274. Fastener 306, such as a screw, extends through slot 266 and is received in threaded insert 290, thereby slideably coupling side rail 248 to side beam 274. Similarly, another fastener 306 extends through slot 266 and is received in threaded insert 290, thereby slideably coupling side rail 245 to side beam 273. Each fastener 306 has a head that engages with a shoulder in slot 266 to keep the fastener aligned in the slot.

Figure 4A:
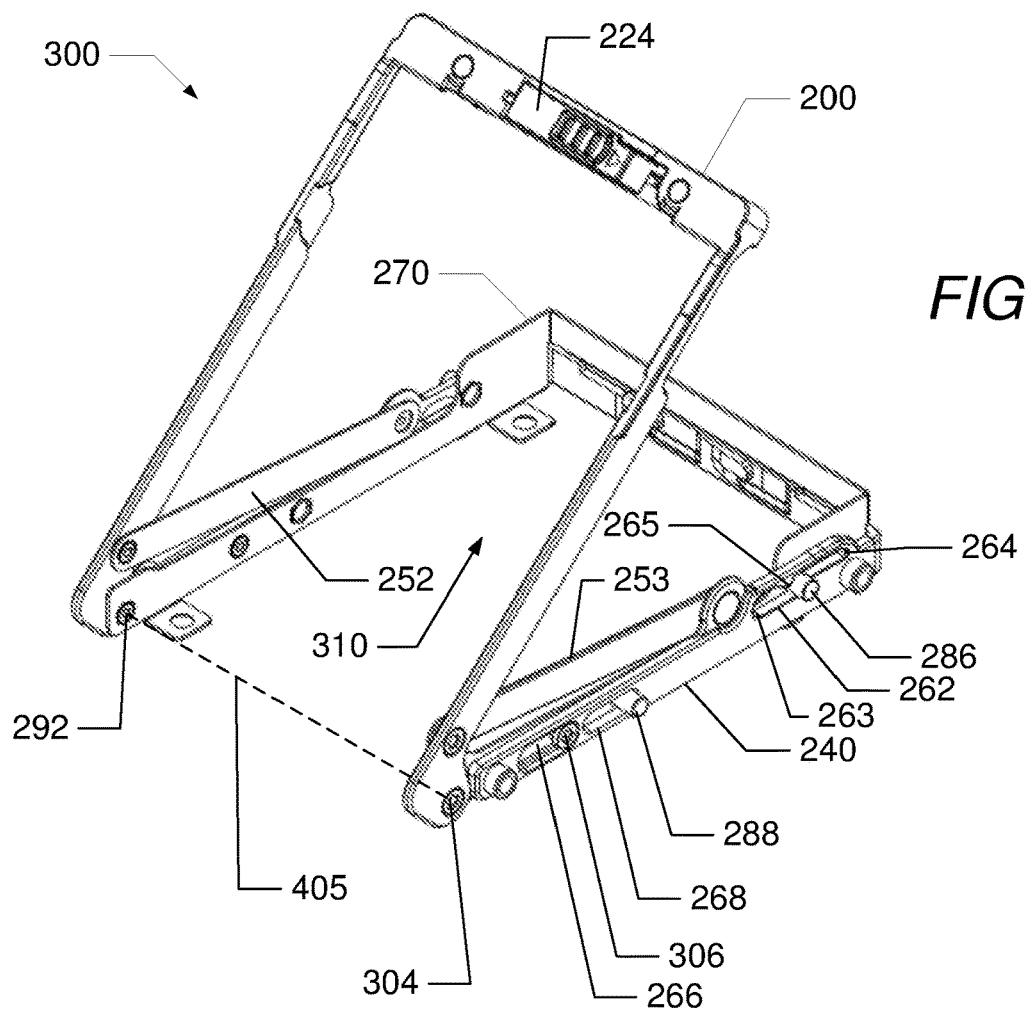
FIG. 4A illustrates a top perspective assembled view of a hard drive carrier with the handle in a partially open position, according to one or more embodiments.

Turning to FIG. 4A, assembled hard drive carrier 300 is shown with handle 200 in a partially open position. Hard drive carrier 300 includes sliding bracket 270 coupled to stationary frame 240 for sliding movement and handle 200 coupled to sliding bracket 270 for rotation about an axis 405 between fastener 304 and threaded insert 292. A cavity 310 is defined within sliding bracket 270, stationary frame 240 and handle 200. In FIG. 4A, fastener 306 is shown seated in slot 266 and guide pin 286 is shown seated in slot 262. Guide pin 288 is shown seated in slot 268.

Figure 4B:
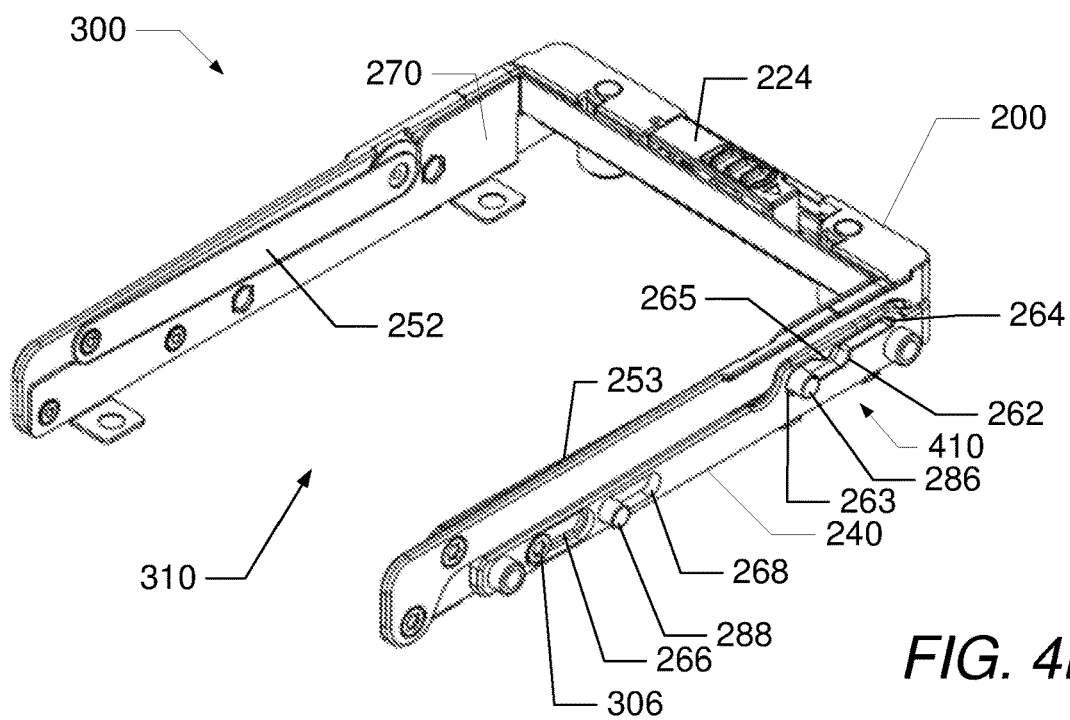
FIG. 4B illustrates a top perspective assembled view of a hard drive carrier with the handle in a closed position, according to one or more embodiments.

With reference to FIG. 4B, assembled hard drive carrier 300 is shown with handle 200 in a closed position. In the closed position, latch 224 of the handle is engaged with hooks 243 (FIG. 2) of the sliding bracket 270. Also in the closed position, guide pin 288 abuts against slot end 263, guide pin 286 abuts against one end of slot 268, and fastener 306 abuts against one end of slot 266. As the sliding bracket 270 moves relative to the stationary frame 240, guide pins 288 slide within slot 262, guide pins 286 slide within slot 268 and fastener 306 slides within slot 266.

A detent mechanism 410 is formed by the combination of slot 262, finger 265 and guide pin 286. Detent mechanism 410 keeps handle 200 in a partially open position and prevents the handle from closing. When handle 200 is in a fully open position, guide pin 286 abuts against slot end 264. As handle 200 is closed, guide pin 286 slides along slot 262 until the guide pin 286 contacts finger 265 as shown in FIG. 4A. In this position, handle 200 is held in a partially open position and prevented from closing. When additional force is applied to close handle 200, guide pin 286 will slide under finger 265 and along slot 262 until the guide pin 286 abuts against slot end 263 where the handle is in a fully closed position, as shown in FIG. 4B.

Figure 5A:
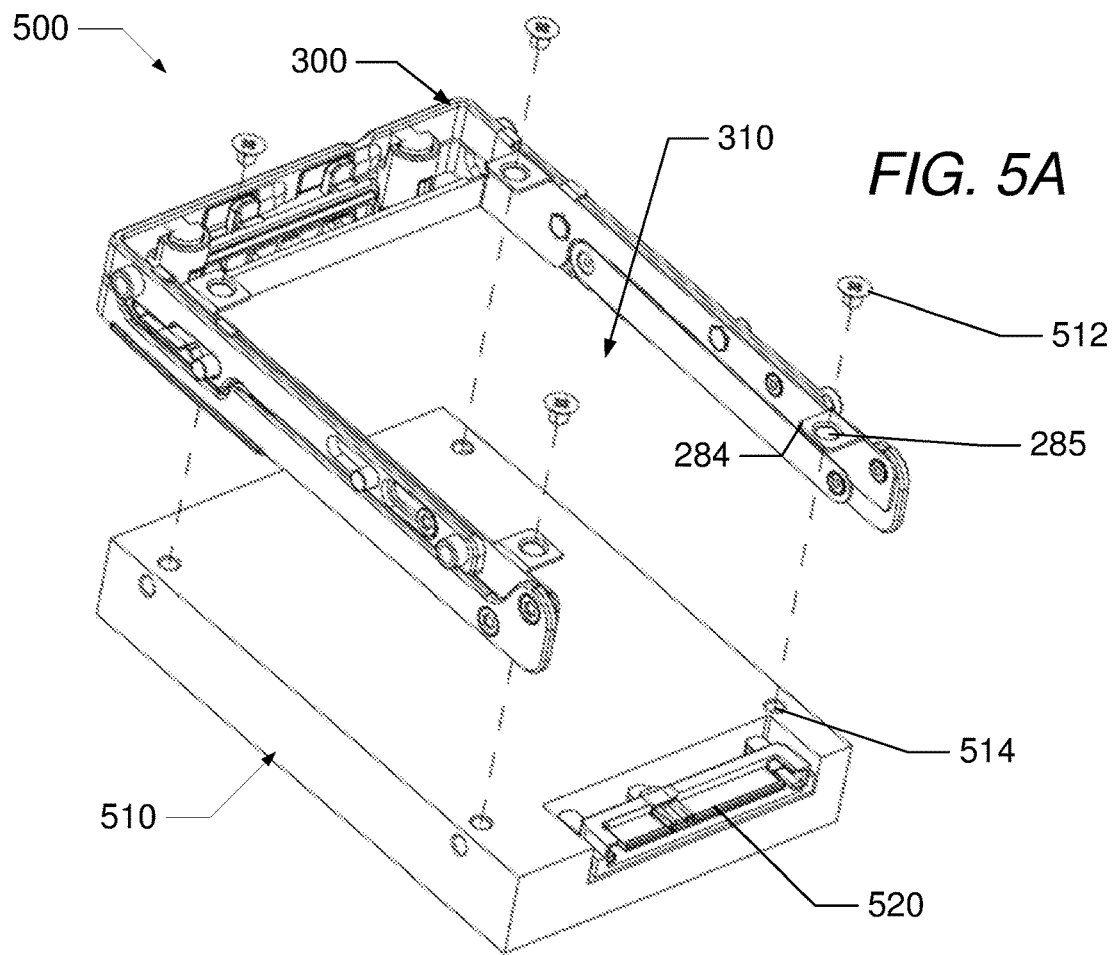
FIG. 5A illustrates a bottom perspective view of a hard drive carrier and a hard drive, according to one or more embodiments.
Figure 5B:
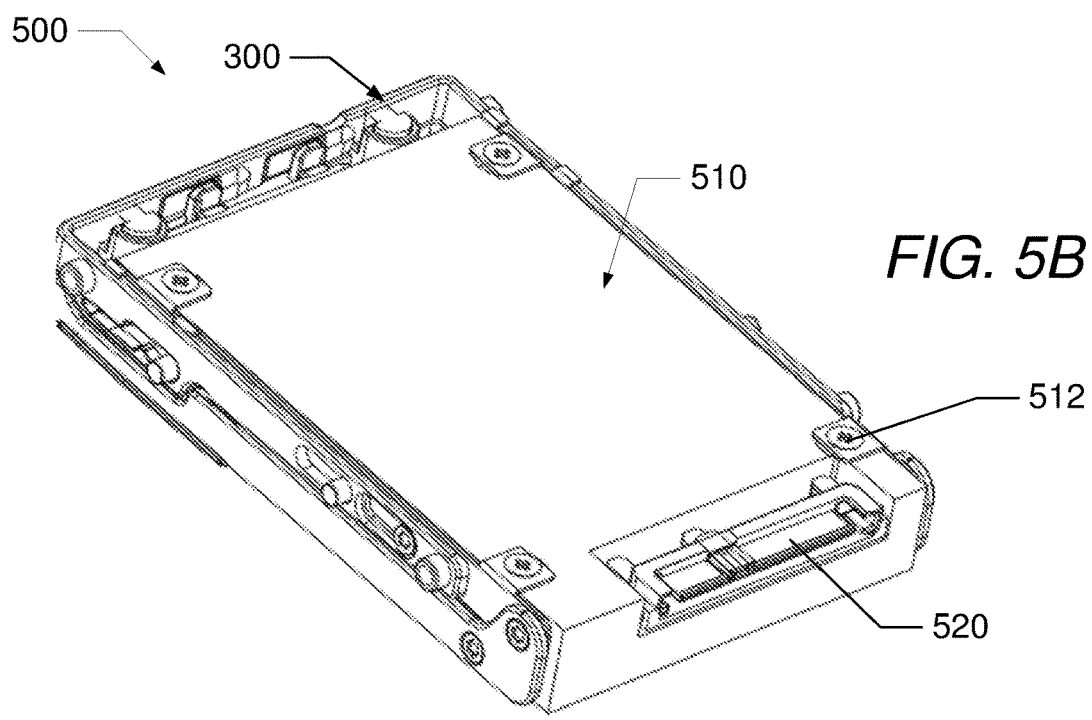
FIG. 5B illustrates a bottom perspective view of a hard drive carrier with an inserted hard drive, according to one or more embodiments.

FIG. 5A illustrates hard drive carrier assembly 500 comprising hard drive carrier 300 and hard drive 510. Cavity 310 of hard drive carrier 300 is dimensioned to receive hard drive 510. Hard drive 510 is mounted in cavity 310. Hard drive 510 includes threaded apertures 514 on one side of the hard drive and a hard drive connector 520. When mated with another connector, hard drive connector 520 can provide power and signal connections to hard drive 510. Fasteners 512, such as screws extend through apertures 285 of tabs 284 and are received in threaded apertures 514 in order to attach hard drive 510 to hard drive carrier 300. The fully built hard drive carrier assembly 500 is shown in FIG. 5B.

Figure 6A:
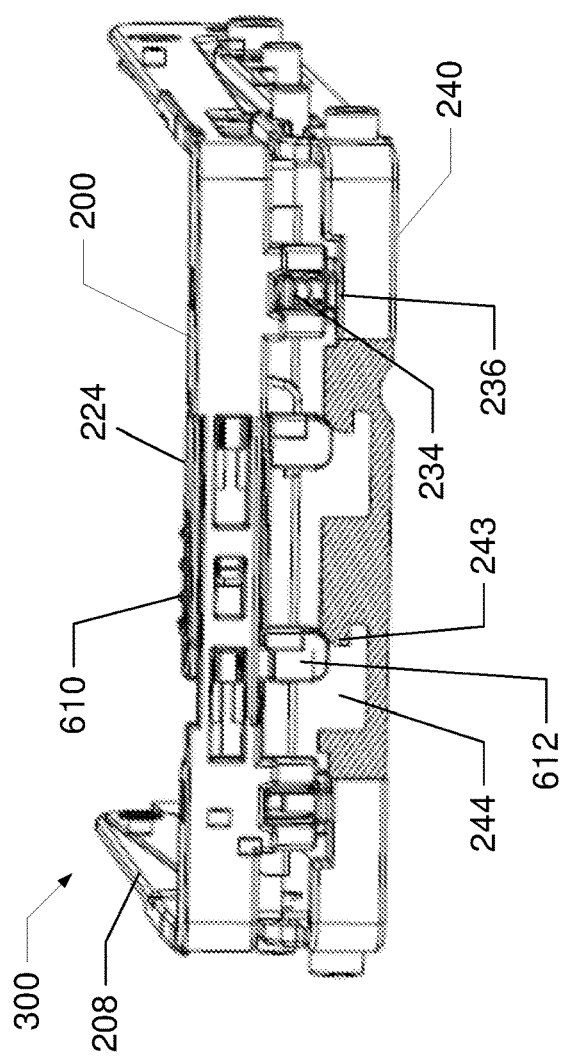
FIG. 6A presents an enlarged front view of a hard drive carrier, illustrating details of a latch starting engagement, according to one or more embodiments.

Referring to FIG. 6A, details of the operation of latch 224 are illustrated. In FIG. 6A, handle 200 is shown in a partially closed position. Latch 224 includes raised ribs 610 and a pair of jaws 612. A user can grasp raised ribs 610 and manually move latch 224 towards side leg 208. As handle 200 is moved from an open position to a partially closed position, jaws 612 enter openings 244 and abut against hooks 243, overcoming the force of spring 226 (FIG. 2A) and causing latch 224 to move toward side leg 208.

Figure 6B:
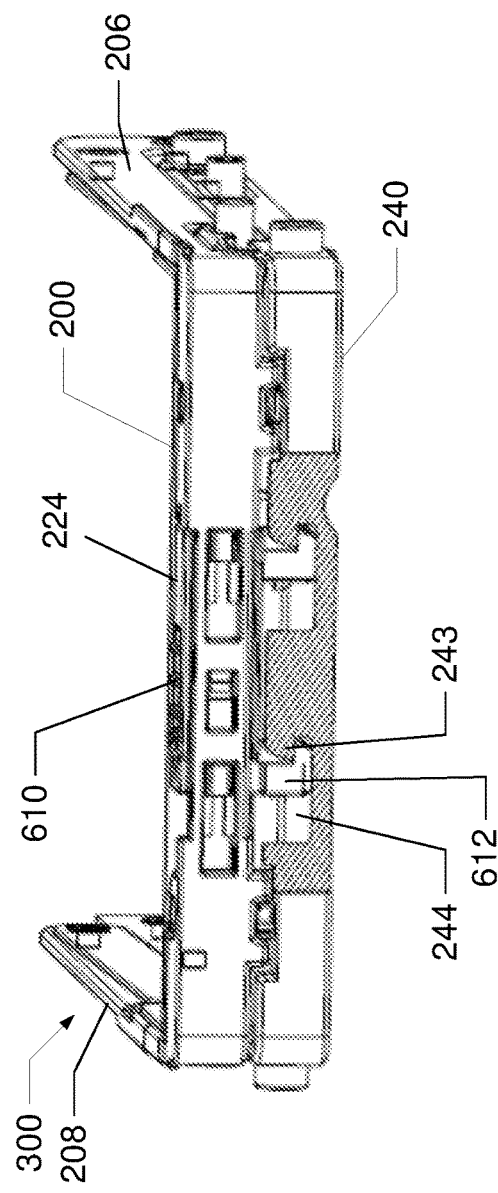
FIG. 6B presents an enlarged front view of a hard drive carrier, illustrating details of a latch in a latched position, according to one or more embodiments.

Turning to FIG. 6B, as handle 200 is moved to a fully closed position, spring 226 moves latch 224 away from side leg 208 and towards side leg 206 causing jaws 612 to fully engage hooks 243, thereby retaining handle 200 to stationary frame 240. Handle 200 can be opened by a user releasing or moving latch 224 towards side leg 208. As latch 224 moves, jaws 612 will be disengaged from hooks 243. At the same time, springs 234 will cause plungers 236 to rotate handle 200 about axis 405 (FIG. 4A) away from stationary frame 240. When latch 224 is released, springs 234 cause the base leg 202 of the handle to pop up away from the stationary frame 240, where the base leg can be grasped by a user.

Figure 7A:
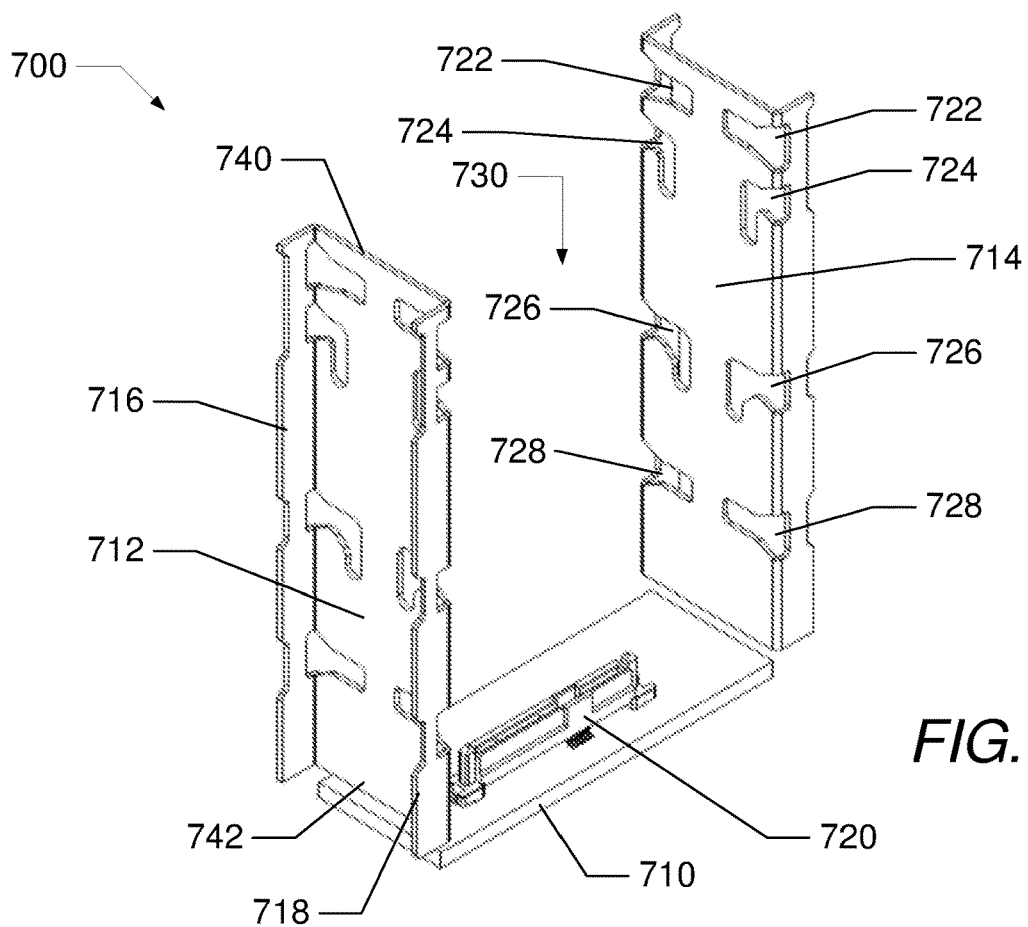
FIG. 7A illustrates a front perspective view of a sled having a hard drive bay, according to one or more embodiments.

FIG. 7A illustrates a sled 700 including a hard drive bay 730. Sled 700 can be part of system enclosure 172 (FIG. 1B) of IHS 100. Sled 700 corresponds to sled 180 of FIG. 2B. Sled 700 comprises spaced apart opposed side walls 712 and 714 and a backplane 710. Backplane 710 can be a printed circuit board that carries electrical signals. Side walls 712, 714 and backplane 710 define hard drive bay 730. While only one hard drive bay 730 is shown in FIG. 7A, sled 700 can have multiple hard drive bays. Each of the side walls 712 and 714 includes a top end 740, a bottom end 742, a front lip 718 and a back lip 716. A backplane connector 720 is mounted to backplane 710. Backplane connector 720 mates with hard drive connector 520 (FIG. 5B) when hard drive assembly 500 is inserted into hard drive bay 730 and the handle is moved in the closed position. Backplane connector 720 can provide power and signal/data connections to hard drive 510 when mated to hard drive connector 520.

Several openings are formed in each of side walls 712 and 714. Y-shaped channels 722 are formed in each of side walls 712 and 714 toward top end 740. Y-shaped channels 722 are formed on the front of each side wall adjacent to front lip 718 and Y-shaped channels 722 are formed on the rear of each side wall adjacent to back lip 716. Y-shaped channels 722 receive guide pins 286 as will be explained later. L-shaped channels 724 are formed in each of side walls 712 and 714 below Y-shaped channels 722. L-shaped channels 724 are formed on the front of each side wall adjacent to front lip 718 and L-shaped channels 724 are formed on the rear of each side wall adjacent to back lip 716.

L-shaped channels 726 are formed in each of side walls 712 and 714 below L-shaped channels 724. L-shaped channels 726 are formed on the front of each side wall adjacent to front lip 718 and L-shaped channels 726 are formed on the rear of each side wall adjacent to back lip 716. Y-shaped channels 728 are formed in each of side walls 712 and 714 below L-shaped channels 726 and above bottom end 742. Y-shaped channels 728 are formed on the front of each side wall adjacent to front lip 718 and Y-shaped channels 728 are formed on the rear of each side wall adjacent to back lip 716. Y-shaped channels 722 receive posts 260 and Y-shaped channels 728 receive posts 261 as will be further explained later. L-shaped channels 724 receive guide pins 286 and L-shaped channels 726 receive guide pins 288 as will be further explained below.

Figure 7B:
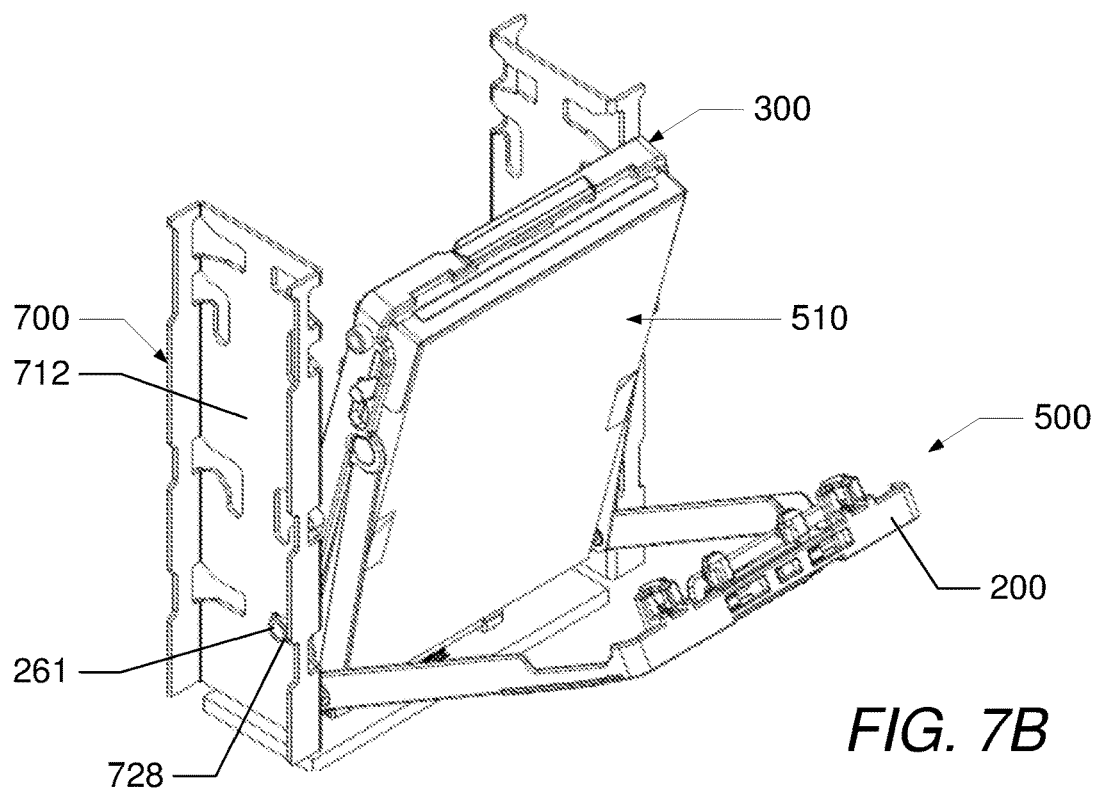
FIG. 7B illustrates a front perspective view of a hard drive carrier partially inserted into a hard drive bay, according to one or more embodiments.

Turning to FIG. 7B, assembly 500 is shown being inserted into sled 700. With the handle 200 in an open position, a user can manually posts 261 into Y-shaped channels 728 in each of the side walls 712 and 714 in order to begin the insertion process of hard drive carrier 300 and hard drive 510 into sled 700.

Figure 8A:
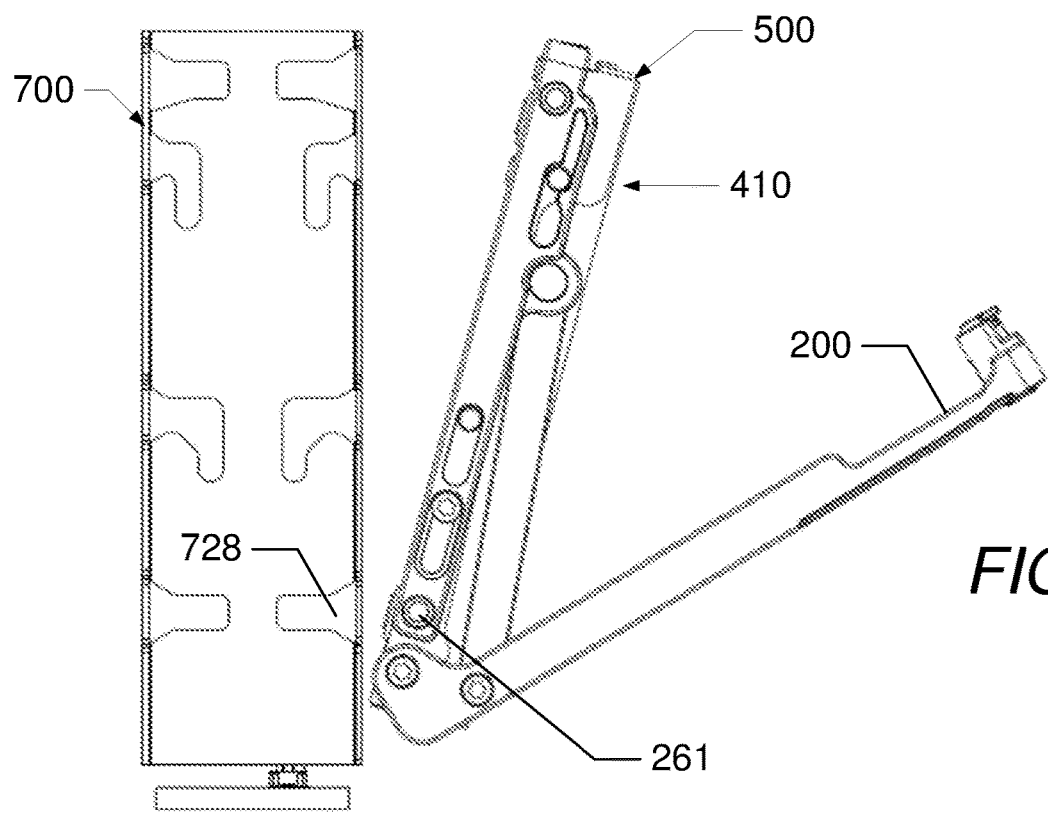
FIG. 8A illustrates a side view of a sled and hard drive carrier, according to one or more embodiments.
Figure 8B:
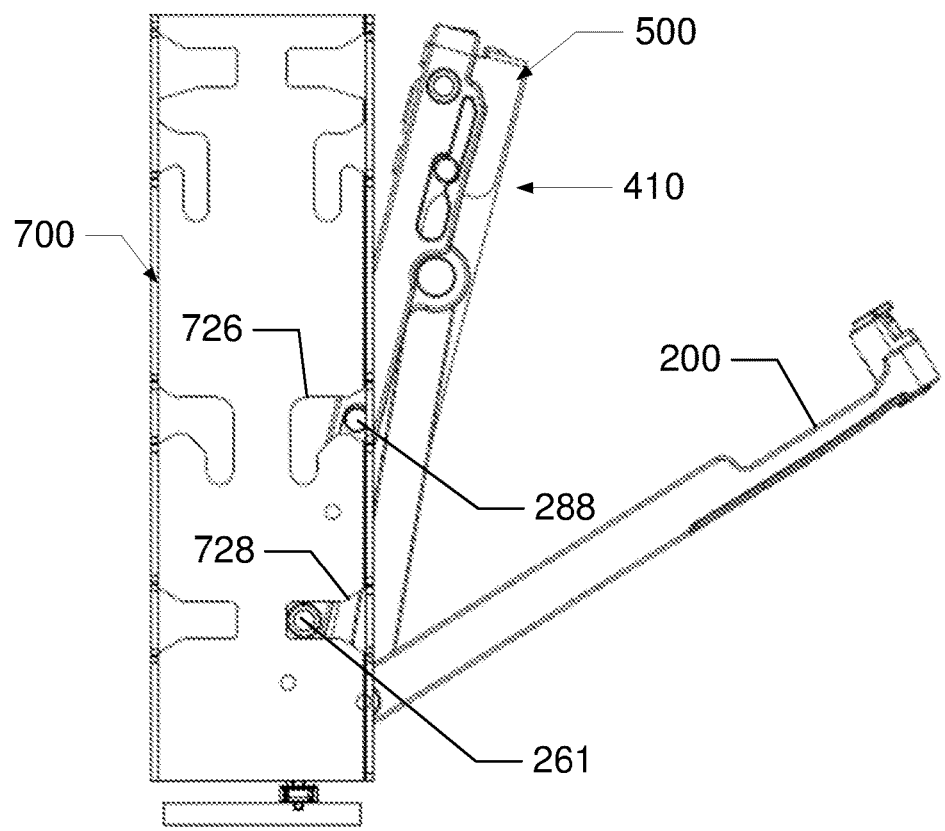
FIG. 8B illustrates a front perspective view of a hard drive carrier partially inserted into a hard drive bay, according to one or more embodiments.

With reference to FIGS. 8A and 8B, hard drive carrier assembly 500 can be inserted into sled 700 by a user initially guiding posts 261 into Y-shaped channels 728. When hard drive carrier assembly 500 is being inserted, the handle 200 is held in a partially open position by detent mechanism 410. Hard drive carrier assembly 500 is then rotated about an axis of posts 261 into the hard drive bay. As hard drive carrier assembly 500 is rotated, guide pins 288 enter L-shaped channels 726 as shown in FIG. 8B. In FIGS. 8A and 8B, the insertion of hard drive carrier assembly 500 is started using posts 261 into Y-shaped channels 728.

Figure 9A:
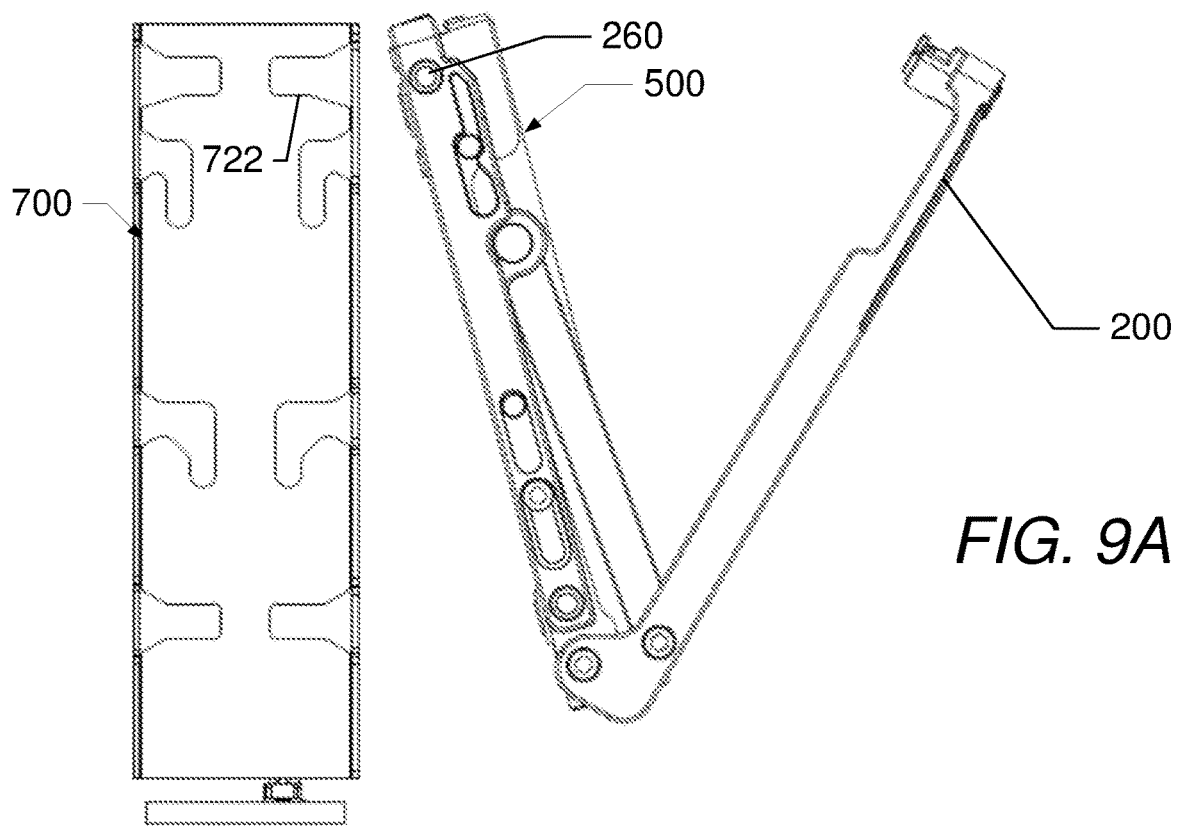
FIG. 9A illustrates a side view of a sled and a hard drive carrier, according to one or more embodiments.
Figure 9B:
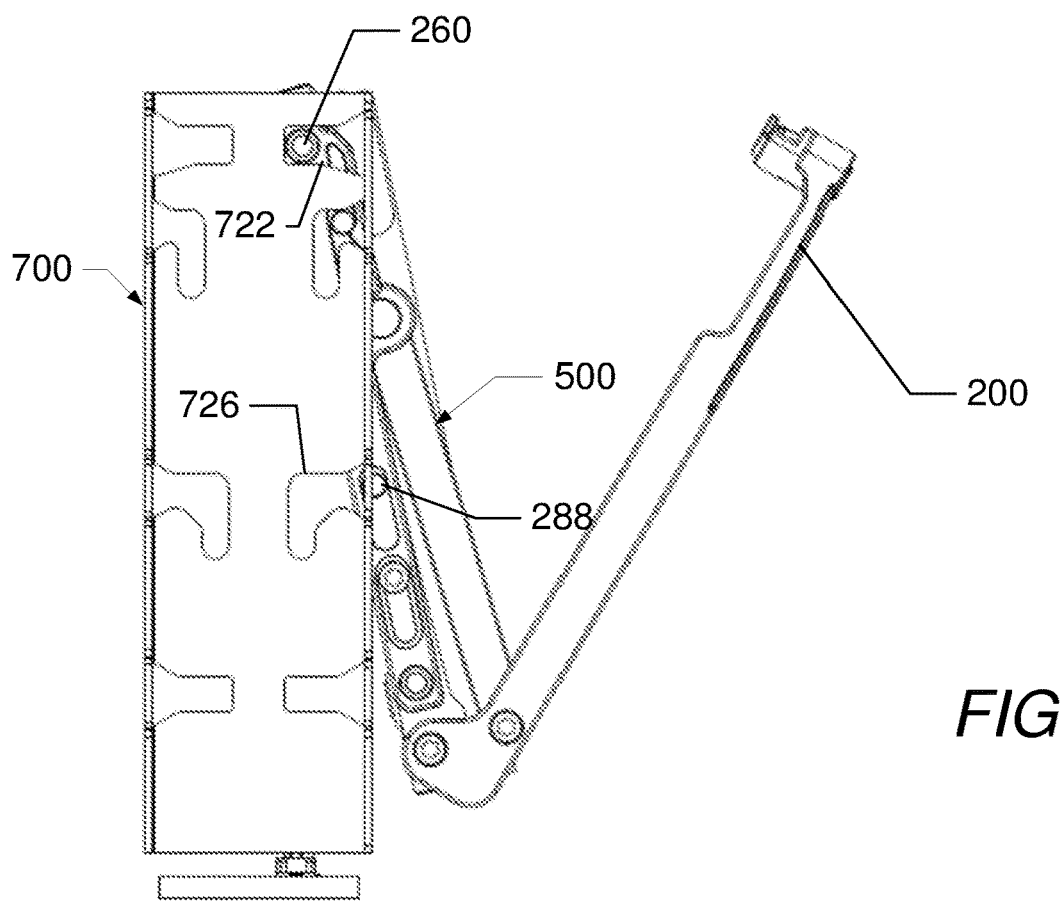
FIG. 9B illustrates a side view of a hard drive carrier partially inserted into a hard drive bay, according to one or more embodiments.

Referring to FIGS. 9A and 9B, hard drive carrier assembly 500 can be also be inserted into sled 700 by a user initially guiding posts 260 into Y-shaped channels 722. When hard drive carrier assembly 500 is being inserted, the handle 200 is held in a partially open position by detent mechanism 410. Hard drive carrier assembly 500 is then rotated about an axis of posts 260 into the hard drive bay. As hard drive carrier assembly 500 is rotated, guide pins 288 enter L-shaped channels 726 as shown in FIG. 9B. In FIGS. 9A and 9B, the insertion of hard drive carrier assembly 500 is started using posts 260 into Y-shaped channels 722.

Figure 10A:
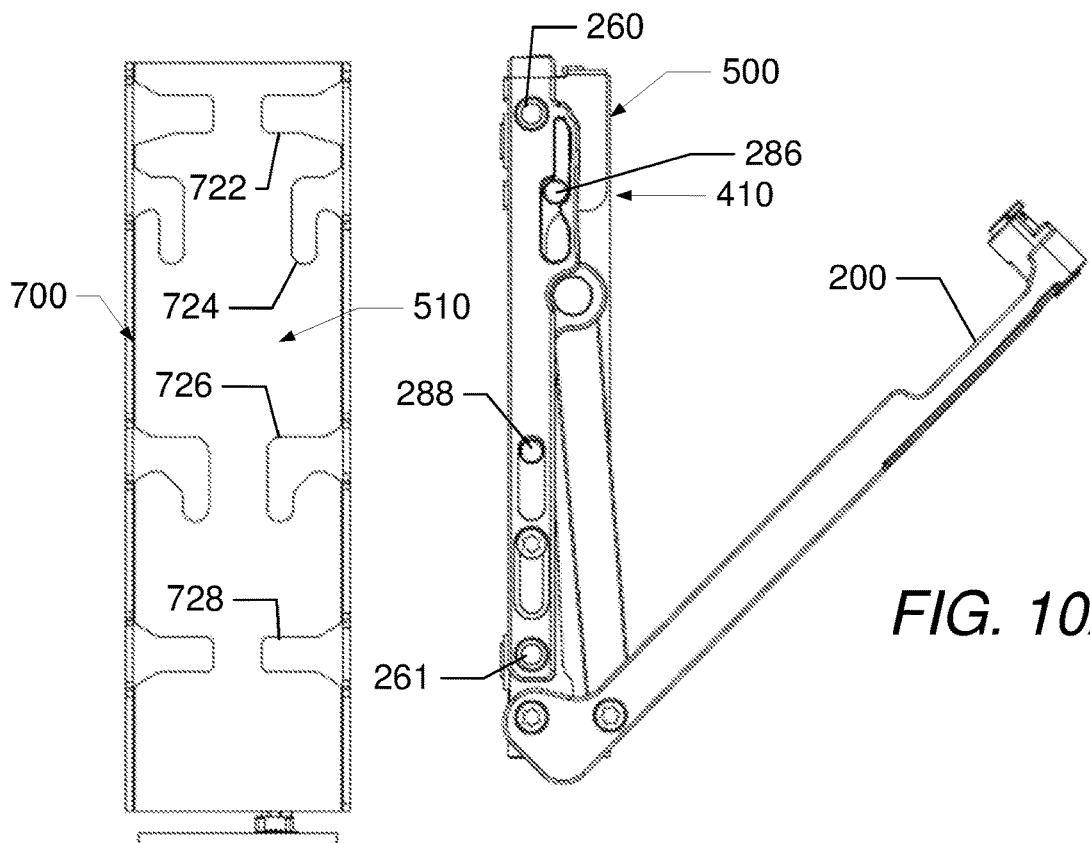
FIG. 10A illustrates a side view of a sled and a hard drive carrier, according to one or more embodiments.
Figure 10B:
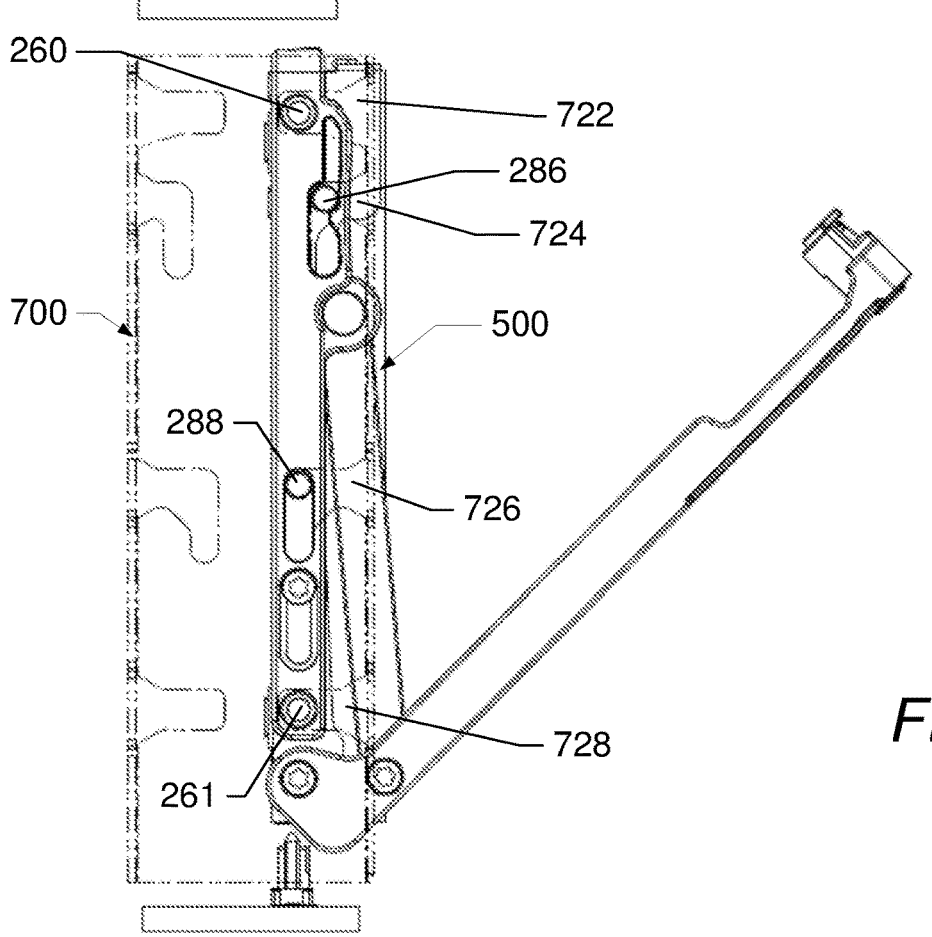
FIG. 10B illustrates a side view of a hard drive carrier inserted into a hard drive bay with the handle in an open position, according to one or more embodiments.

FIGS. 10A-D illustrates a sequence of steps of inserting and securing hard drive carrier assembly 500 into sled 700. With specific reference to FIG. 10A, hard drive carrier assembly 500 is shown with handle 200 being held in a partially open position by detent mechanism 410. Hard drive carrier assembly 500 can be inserted into sled 700 by a user initially guiding either posts 261 into Y-shaped channels 728 or posts 260 into Y-shaped channels 722. Hard drive carrier assembly 500 is then manually rotated about an axis of one set of the posts into the hard drive bay 510. In FIG. 10B, hard drive carrier assembly 500 is shown in hard drive bay 510 with posts 260 seated in Y-shaped channels 722, posts 261 seated in Y-shaped channels 728, guide pins 286 seated in L-shaped channels 724, and guide pins 288 seated in L-shaped channels 726.

Figure 10C:
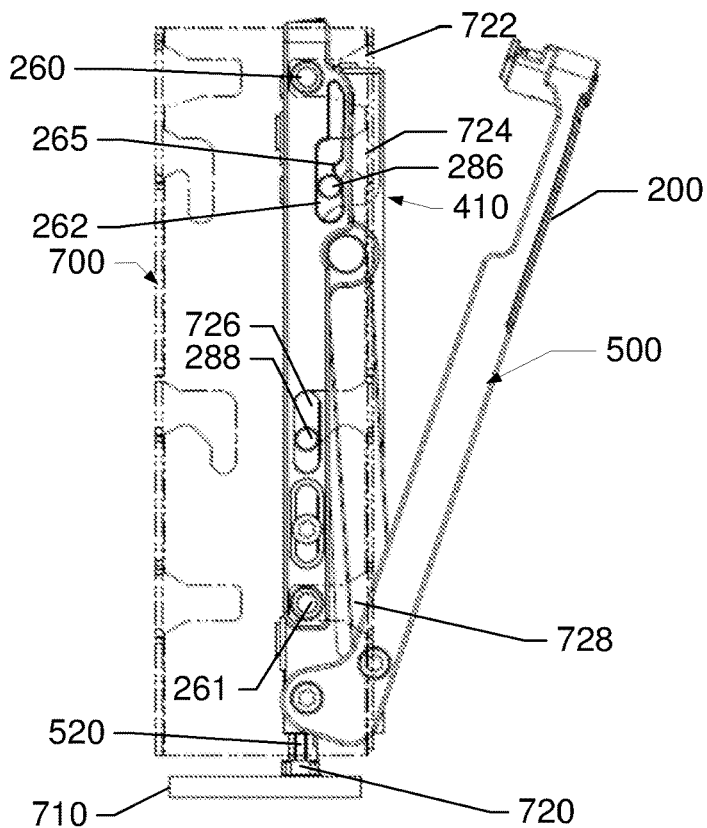
FIG. 10C illustrates a side view of a hard drive carrier inserted into a hard drive bay with the handle in a partially closed position, according to one or more embodiments.

Turning to FIG. 10C, handle 200 is shown being manually moved from a partially open position towards a closed position. When additional manual force is applied to close handle 200, guide pin 286 will slide past finger 265 and along slot 262. As the handle closes, the sliding bracket 270 along with the attached hard drive 510 moves or translates toward backplane 710. Also, as the handle closes, guide pins 286 slide downwardly in L-shaped channels 724 and guide pins 288 slide downwardly in L-shaped channels 726. At the same time, hard drive connector 520 begins engagement with backplane connector 720. Because posts 260 are seated in Y-shaped channels 722 and posts 261 are seated in Y-shaped channels 728, the stationary frame 240 does not move relative to sled 700. The force of handle 200 being rotated about axis 405 (FIG. 4A) and arms 252, 253 fixed to stationary frame 240 causes sliding bracket 270 to move toward backplane 710 and the hard drive connector 520 to engage with the backplane connector 720.

Figure 10D:
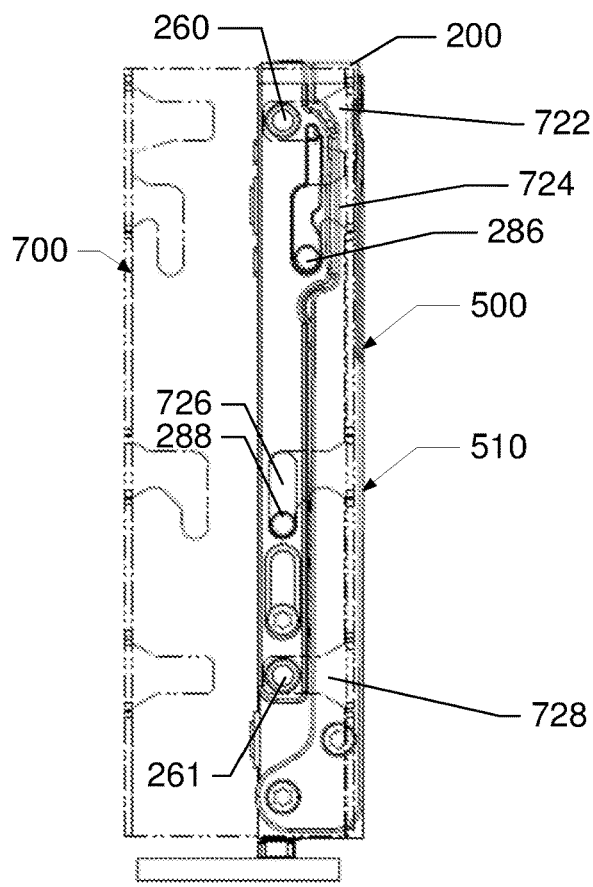
FIG. 10D illustrates a side view of a hard drive carrier inserted into a hard drive bay with the handle in a closed position, according to one or more embodiments.

Referring to FIG. 10D, hard drive assembly 500 is shown secured in sled 700 with handle 200 in a closed position. As handle 200 is closed, guide pins 286 will contact the bottom of L-shaped channels 724 and guide pins 288 will contact the bottom of L-shaped channels 726. The sliding bracket 270 is now secured in sled 700. At the same time, the hard drive connector 520 will become fully engaged with backplane connector 720.

Figure 11A:
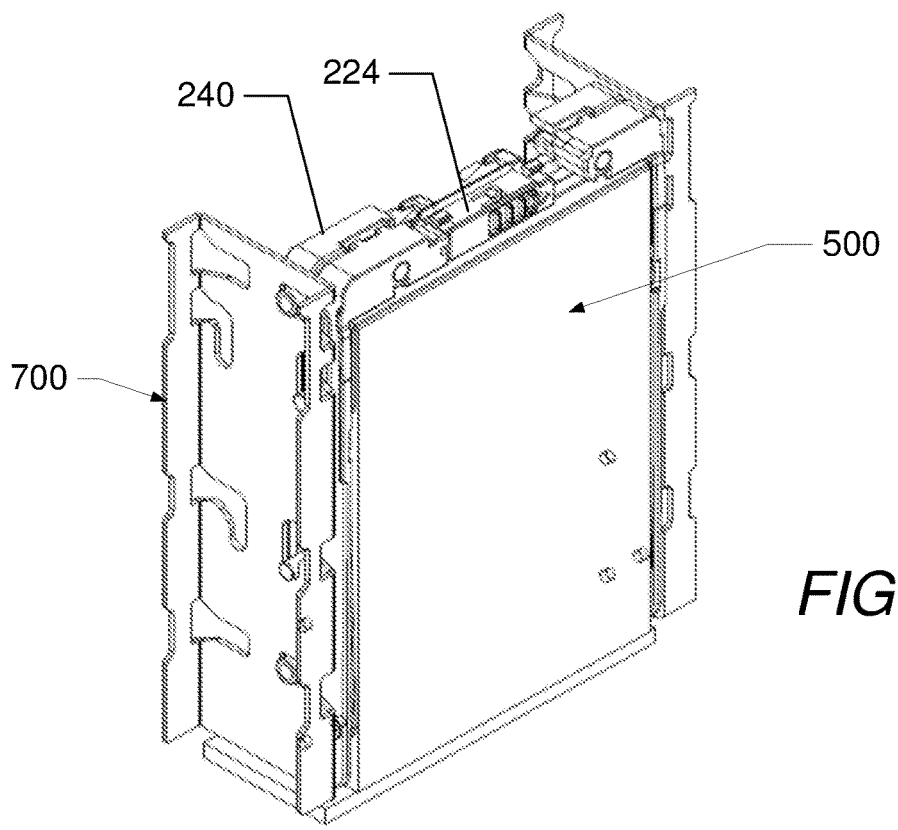
FIG. 11A illustrates a front perspective view of a hard drive carrier inserted into a sled, according to one or more embodiments.
Figure 11B:
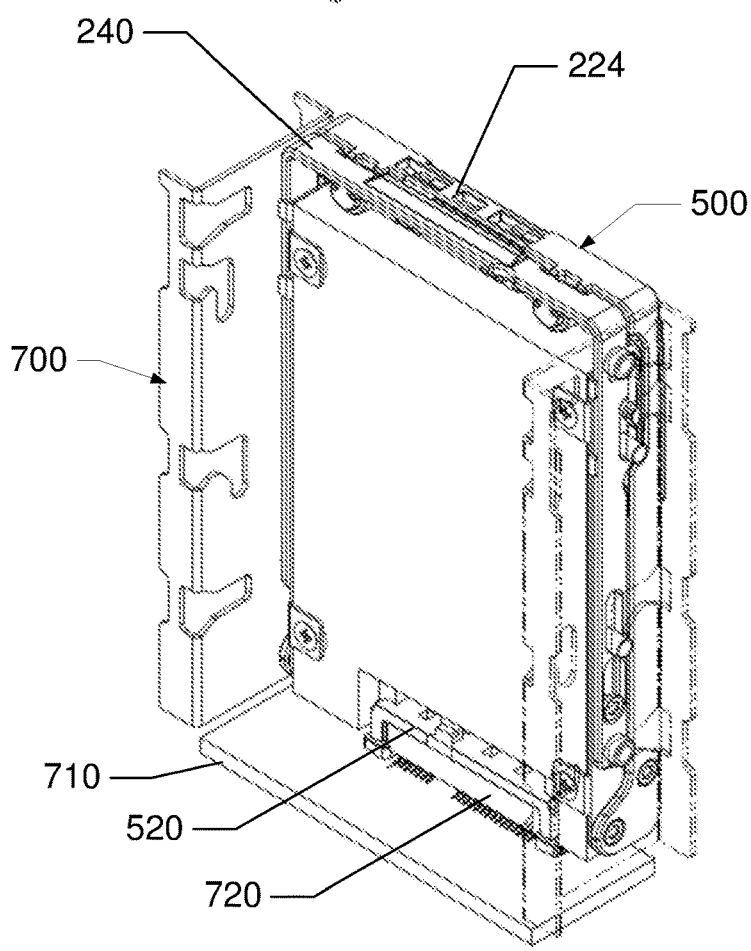
FIG. 11B illustrates a rear perspective view of a hard drive carrier inserted into a sled, according to one or more embodiments.

Turning to FIGS. 11A and 11B, when handle 200 is fully closed, latch 224 is engaged with the stationary frame 240, which keeps hard drive carrier assembly 500 retained in sled 700. Hard drive connector 520 is shown engaged with backplane connector 720. With additional reference to FIGS. 6A and 6B, as handle 200 is moved from an open position to a partially closed position, jaws 612 enter openings 244 and abut against hooks 243, overcoming the force of spring 226 and causing latch 224 to move toward side leg 208. As handle 200 is moved to a fully closed position, spring 226 moves latch 224 away from side leg 208 and towards side leg 206 causing jaws 612 to fully engage hooks 243, thereby retaining handle 200 to stationary frame 240.

Figure 12:
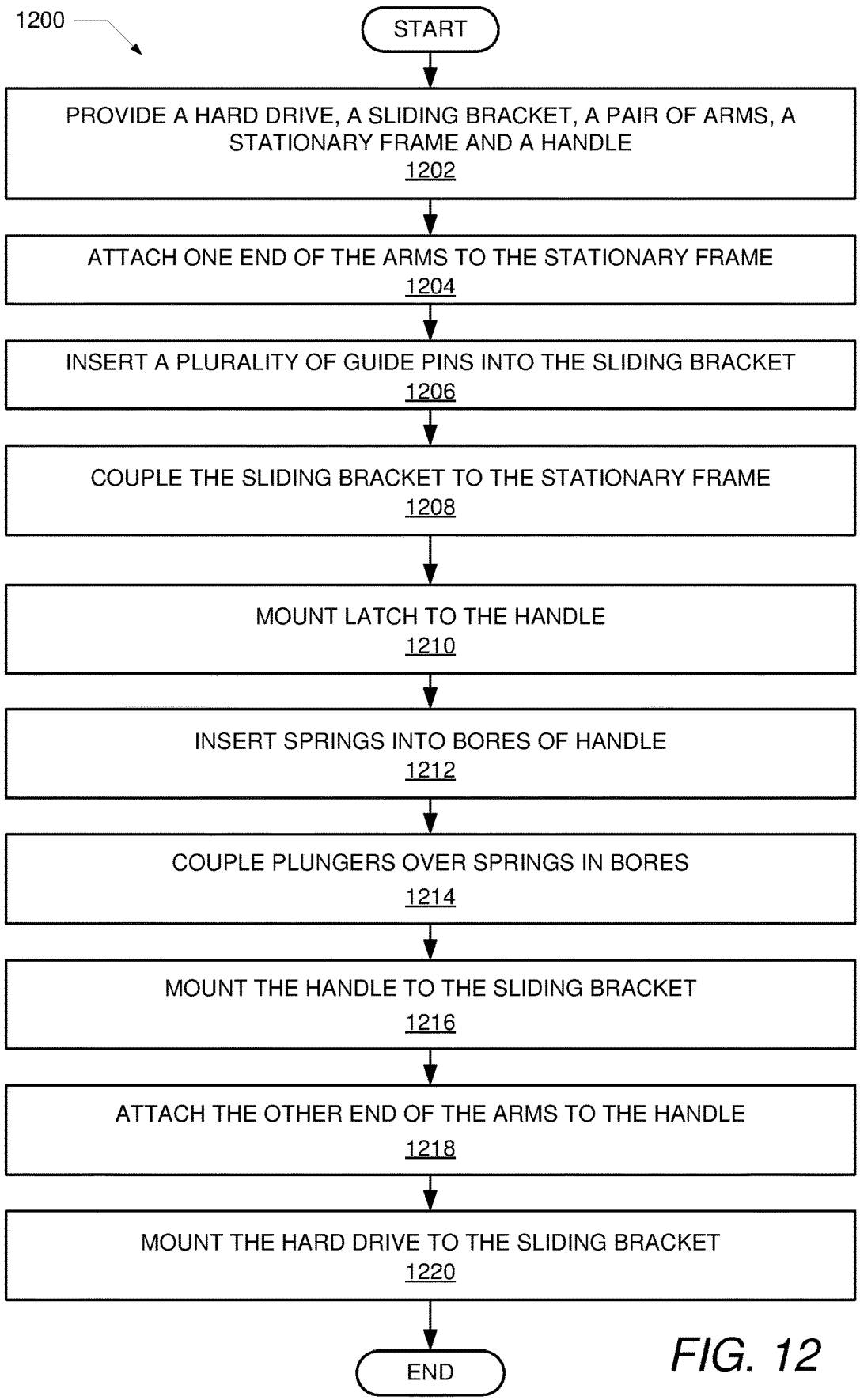
FIG. 12 is a flow chart illustrating an example of a method of manufacturing the hard drive carrier, according to one or more embodiments.

FIG. 12 illustrates a flowchart of an exemplary method 1200 for manufacturing hard drive carrier assembly 500 of the preceding figures. The description of the method is provided with general reference to the specific components illustrated within the preceding FIGS. 1A-11B. With specific reference to FIG. 12, method 1200 begins at the start block and proceeds to block 1202 where hard drive 510, sliding bracket 270, pair of arms 252 and 253, stationary frame 240 and handle 200 are provided. One end of each of the arms 252 and 253 are attached to stationary frame 240 using pivot pins 258 (block 1204). Guide pins 286 and 288 are inserted into sliding bracket 270 (block 1206). Sliding bracket 270 is slideably coupled to stationary frame 240 using fasteners 306. (block 1208).

At block 1210, latch 224 is mounted to handle 200. Springs 234 are inserted into bores 231 of the handle 200 (block 1212). Plungers 236 are coupled into the bores 231 such that the springs are disposed between the plunger and the handle (block 1214). The handle 200 is mounted to the sliding bracket 270 using fasteners 304 (block 1216) and the other end of the arms are attached to the handle using fasteners 302 (block 1218). The hard drive 510 is mounted to the sliding bracket 270 using fasteners 512 (block 1220). Method 1200 concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system comprising:
   a hard drive carrier comprising:
   a sliding bracket dimensioned to receive a hard drive;
   a stationary frame coupled to the sliding bracket;
   a handle coupled to both the sliding bracket and the stationary frame, the handle being rotatable about an axis between an open or partially open and a closed position; and
   a detent mechanism coupled between the sliding bracket and the stationary frame, the detent mechanism preventing the handle from closing until the hard drive carrier is in a fully-inserted position, the detent mechanism comprising;
   wherein the hard drive carrier is configured to:
   engage with a sled to hold the hard drive carrier at a first partially-inserted position in the sled while the handle is in the partially open position, the first partially-inserted position allowing partial insertion of the hard drive carrier into the sled while the detent mechanism prevents the handle from closing; and
   move to the fully inserted position, the hard drive carrier transitioning into a hard drive bay of the sled in the fully-inserted position, with the handle rotated into a closed position, wherein in the closed position a latch of the handle is engaged with hooks of the sliding bracket.

2. The information handling system of claim 1, wherein:
   the hard drive carrier is further configured to translate from the partially-inserted position to the fully-inserted position when the handle is closed, where the sliding bracket moves relative to the stationary frame when the handle is closed; and
   the information handling system further comprises a hard drive connector that is disengaged from a backplane connector when the hard drive carrier is in the partially-inserted position, the hard drive connector being engaged with the backplane connector while the hard drive carrier is in the fully-inserted position.

3. The information handling system of claim 1, wherein the hard drive carrier further comprises:
a pair of opposed posts extending from opposite sides of the stationary frame, the posts configured to be received by channels in opposed sled walls, the hard drive carrier rotating about the posts from the first position to the second position.

4. The information handling system of claim 1, wherein the hard drive carrier further comprises:
a pair of arms coupled between the handle and the stationary frame, each of the arms having a first end and a second end, the first end of the arms rotatably coupled to the handle and the second end of the arms rotatably coupled to the stationary frame.

5. The information handling system of claim 1, wherein:
the stationary frame comprises a base rail and a first side rail and an opposed second side rail, both extending from the base rail;
the hard drive carrier further comprises:
a first slot located in the first side rail;
a second slot located in the second side rail;
the sliding bracket comprising a base beam and a first and a second side beam extending from the base beam;
a first guide pin extending from the first side beam; and
a second guide pin extending from the second side beam;
wherein the first guide pin is disposed for sliding movement in the first slot and the second guide pin is disposed for sliding movement in the second slot.

6. The information handling system of claim 1, wherein the hard drive carrier further comprises:
a latch coupled to the handle, the latch configured to engage with the stationary frame when the handle is in the closed position to retain the handle to the stationary frame.

7. The information handling system of claim 1, wherein the detent mechanism comprises a combination of a slot, a finger and a guide pin, and the detent mechanism keeps the handle in a partially open position.

8. The information handling system of claim 7, wherein:
when the handle is in a fully open position, the guide pin abuts against a slot end and as the handle is closed, the guide pin slides along the slot until the guide pin contacts the finger, wherein the handle is held in a partially open position and prevented from closing; and
in response to application of additional force to close the handle, the guide pin slides under the finger and along the slot until the guide pin abuts against another slot end, where the handle is in a fully closed position.

9. The hard drive carrier of claim 1, wherein the detent mechanism comprises a combination of a slot, a finger and a guide pin, and the detent mechanism keeps the handle in a partially open position.

10. The hard drive carrier of claim 9, wherein:
when the handle is in a fully open position, the guide pin abuts against a slot end and as the handle is closed, the guide pin slides along the slot until the guide pin contacts the finger, wherein the handle is held in a partially open position and prevented from closing; and
in response to application of additional force to close the handle, the guide pin slides under the finger and along the slot until the guide pin abuts against another slot end, where the handle is in a fully closed position.

11. The information handling system of claim 5, wherein the detent mechanism further comprises:
a third slot located in the first side rail;
a fourth slot located in the second side rail;
a third guide pin extending from the first side beam; and
a fourth guide pin extending from the second side beam;
wherein the third guide pin is disposed for sliding movement in the third slot and the fourth guide pin is disposed for sliding movement in the fourth slot.

12. The information handling system of claim 11, further comprising:
a first pair of channels located in opposed sled walls; and
a second pair of channels located in the opposed sled walls, the first pair of channels receiving the first and second guide pins and the second pair of channels receiving the third and fourth guide pins when the hard drive carrier is in the second position.

13. A hard drive carrier comprising:
a sliding bracket dimensioned to receive a hard drive;
a stationary frame coupled to the sliding bracket;
a handle coupled to both the sliding bracket and the stationary frame, the handle being rotatable about an axis between an open or partially open and a closed position; and
a detent mechanism coupled between the sliding bracket and the stationary frame, the detent mechanism preventing the handle from closing until the hard drive carrier is in a fully-inserted position;
the hard drive carrier being configured to:
engage with a sled to hold the hard drive carrier at a partially-inserted position in the sled while the handle is in a partially open position, the partially-inserted position allowing insertion of the hard drive carrier into the sled while the detent mechanism prevents the handle from closing; and
move to the fully-inserted position, the hard drive carrier transitioning into a hard drive bay of the sled in the fully-inserted position, with the handle rotated into a closed position, wherein in the closed position a latch of the handle is engaged with hooks of the sliding bracket.

14. The hard drive carrier of claim 13, wherein:
the hard drive carrier is further configured to translate from the partially-inserted position to the fully-inserted position when the handle is closed, where the sliding bracket moves relative to the stationary frame when the handle is closed; and
the hard drive carrier further comprising a hard drive connector that is disengaged from a backplane connector when the hard drive carrier is in the partially-inserted position, the hard drive connector being engaged with the backplane connector while the hard drive carrier is in the fully-inserted position.

15. The hard drive carrier of claim 13, further comprising:
a pair of opposed posts extending from opposite sides of the stationary frame, the posts configured to be received by channels in opposed sled walls, the hard drive carrier rotating about the posts from the first position to the second position.

16. The hard drive carrier of claim 13, further comprising:
a pair of arms coupled between the handle and the stationary frame, each of the arms having a first end and a second end, the first end of the arms rotatably coupled to the handle and the second end of the arms rotatably coupled to the stationary frame.

17. The hard drive carrier of claim 13, wherein the detent mechanism further comprises:
a third slot located in the first side rail;
a fourth slot located in the second side rail;
a third guide pin extending from the first side beam; and
a fourth guide pin extending from the second side beam,
wherein the third guide pin is disposed for sliding movement in the third slot and the fourth guide pin is disposed for sliding movement in the fourth slot.

18. The hard drive carrier of claim 13, wherein the hard drive carrier further comprises:
   a latch coupled to the handle, the latch configured to engage with the stationary frame when the handle is in the closed position to retain the handle to the stationary frame.

19. The hard drive carrier of claim 13, wherein:
   the stationary frame comprises a base rail and a first side rail and an opposed second side rail both extending from the base rail;
   the hard drive carrier further comprises:
      a first slot located in the first side rail;
      a second slot located in the second side rail;
      the sliding bracket comprising a base beam and a first and a second side beam extending from the base beam;
      a first guide pin extending from the first side beam; and
      a second guide pin extending from the second side beam, wherein the first guide pin is disposed for sliding movement in the first slot and the second guide pin is disposed for sliding movement in the second slot.

20. The hard drive carrier of claim 19, further comprising:
   a first pair of channels located in opposed sled walls; and
   a second pair of channels located in the opposed sled walls, the first pair of channels receiving the first and second guide pins and the second pair of channels receiving the third and fourth guide pins when the hard drive carrier is in the second position.

\* \* \* \* \*